(12) United States Patent
Yokozeki et al.

(10) Patent No.: US 6,594,190 B2
(45) Date of Patent: Jul. 15, 2003

(54) SEMICONDUCTOR DEVICE WITH OUTPUT LATCH CIRCUIT OUTPUTTING COMPLEMENTARY DATA AT HIGH SPEED

(75) Inventors: Wataru Yokozeki, Kawasaki (JP); Kazuto Furumochi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 55 days.

(21) Appl. No.: 09/864,274

(22) Filed: May 25, 2001

(65) Prior Publication Data

US 2002/0079543 A1 Jun. 27, 2002

(30) Foreign Application Priority Data

Dec. 22, 2000 (JP) ........................................ 2000-391368

(51) Int. Cl.[7] ................................................. G11C 7/02
(52) U.S. Cl. .................... 365/205; 365/189.05; 365/233
(58) Field of Search ...................... 365/230.01, 189.01, 365/189.05, 205, 233

(56) References Cited

U.S. PATENT DOCUMENTS

| 5,642,319 | A | * | 6/1997 | Nagashima | 365/207 |
|---|---|---|---|---|---|
| 5,648,932 | A | * | 7/1997 | Kang | 365/194 |
| 5,684,752 | A | * | 11/1997 | Mills et al. | 365/230.03 |
| 5,955,896 | A | * | 9/1999 | Horiguchi et al. | 326/95 |
| 5,999,480 | A | * | 12/1999 | Ong et al. | 365/230.06 |
| RE36,655 | E | * | 4/2000 | Kozaru et al. | 365/189.05 |
| 6,088,292 | A | * | 7/2000 | Takahashi | 365/233 |
| 6,097,635 | A | * | 8/2000 | Chang | 365/185.21 |
| 6,134,153 | A | * | 10/2000 | Lines et al. | 365/189.02 |
| 6,163,501 | A | * | 12/2000 | Ohshima et al. | 365/233 |
| 6,301,180 | B1 | * | 10/2001 | Sudo et al. | 365/207 |
| 6,320,818 | B1 | * | 11/2001 | Matsubara | 35/233 |
| 6,366,507 | B1 | * | 4/2002 | Akioka et al. | 365/194 |
| 2001/0048633 | A1 | * | 12/2001 | Noguchi | 365/230.08 |
| 2002/0024864 | A1 | * | 2/2002 | Sudo et al. | 365/207 |
| 2002/0118047 | A1 | * | 8/2002 | Sim | 327/52 |

FOREIGN PATENT DOCUMENTS

JP    7-245558    9/1995

* cited by examiner

*Primary Examiner*—Viet Q. Nguyen
(74) *Attorney, Agent, or Firm*—Arent Fox Kintner Plotkin & Kahn, PLLC

(57) ABSTRACT

A semiconductor device includes two latch circuits, each of which latches a corresponding one of complementary data outputs supplied from an amplifier circuit, and includes only one intervening gate from an input thereof to an output thereof, the latch circuits being reset by an activation signal that activates the amplifier circuit.

15 Claims, 8 Drawing Sheets

FIG. 9
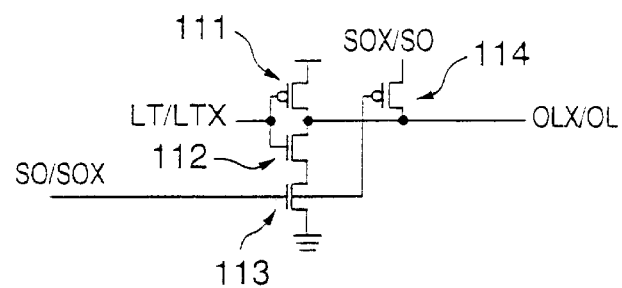
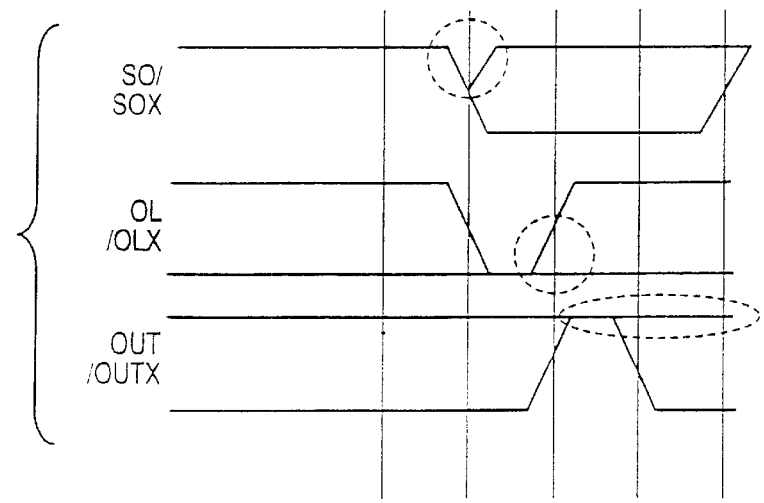
FIG. 10

FIG. 11
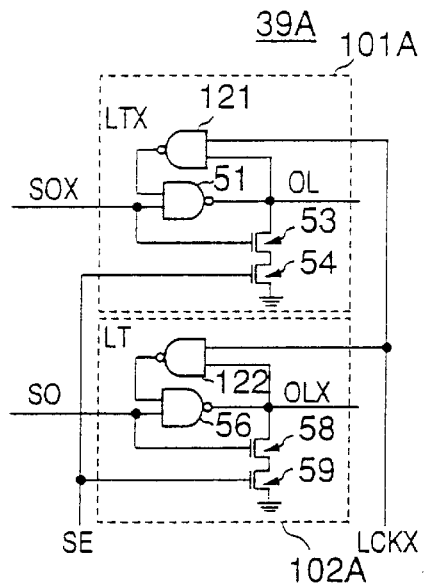
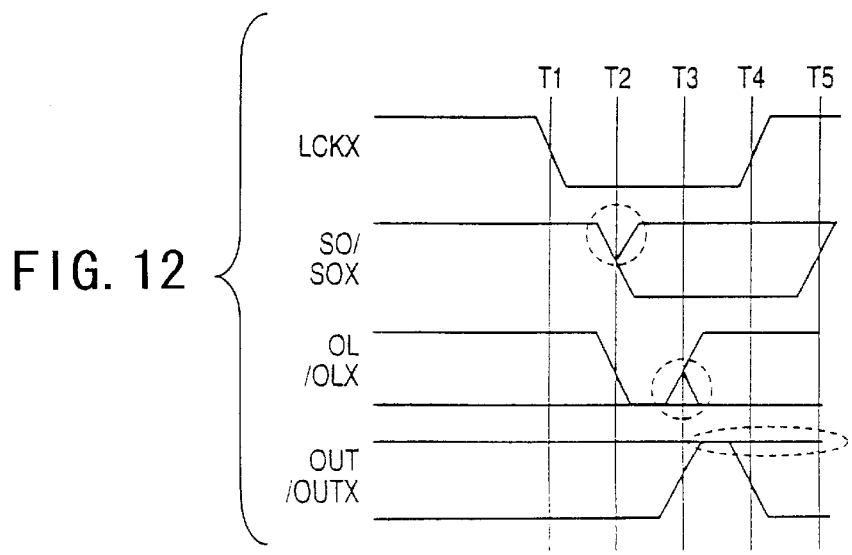
FIG. 12

US 6,594,190 B2

SEMICONDUCTOR DEVICE WITH OUTPUT LATCH CIRCUIT OUTPUTTING COMPLEMENTARY DATA AT HIGH SPEED

BACKGROUND OF THE INVENTION

1. Field of the Invention

The present invention generally relates to output latch circuits and semiconductor devices, and particularly relates to an output latch circuit for outputting complementary data and a semiconductor memory device having such an output latch circuit therein.

2. Description of the Related Art

FIG. 1 shows an output latch circuit that outputs complementary data in a related-art semiconductor memory device. This output latch circuit includes clocked gate inverters 11 through 14 and inverters 15 through 19. Complementary signals SOX and SO that are output from a sense amplifier are input to the clocked gate inverters 11 and 12, respectively. ("X" at the end of a signal name indicates a negative logic signal that is an inverse of the signal without "X" at the end of the signal name thereof). The clocked gate inverter 13 and the inverter 15 together form a latch, and the clocked gate inverter 14 and the inverter 16 together form another latch.

Output enable signals OE and OEX are supplied to the clocked gate inverters 11 through 14 as gate signals. Each clocked gate inverter inverts an input signal, and supplies the inverted signal as an output signal when the output enable signal OE is HIGH.

FIG. 2 is a timing chart showing operation timings of the output latch circuit of FIG. 1. As shown in FIG. 2, the complementary signals SO and SOX that are output from an sense amplifier start appearing around timing T1, and are sensed by the sense amplifier to be locked to either a HIGH level or a LOW level. At timing T2, the output enable signal OE is supplied. At timing T4 that is two delays after the timing T2 where one delay corresponds to a delay by one gate, latch outputs OL and OLX appear. The reason why there are two gate delays is that the sense amplifier output SO, for example, appears as the latch output OLX after passing through two gates that are the clocked gate inverters 12 and 16. Output signals OUT and OUTX of the output latch circuit appear at timing T5 from the inverters 18 and 17, respectively.

As is understood from the above description, in the related-art output latch circuit of FIG. 1, data is output following a timing margin from timing T1 to timing T2 and three gate delays from timing T2 to timing T5 after the data of the sense amplifier is locked. In an attempt to reduce the delay of data output timing as described above, an output latch circuit has been provided that does not rely on output enable signals.

FIG. 3 shows an output latch circuit that does not rely on output enable signals in a related-art semiconductor memory device. The output latch circuit of FIG. 3 includes NAND circuits 21 and 22 and inverters 23 and 24. The NAND circuits 21 and 22 have outputs thereof that are input to each other, thereby together forming a latch. Complementary signals SOX and SO that are output from a sense amplifier are input to the remaining input nodes of the NAND circuits 21 and 22.

FIG. 4 is a timing chart showing operation timings of the output latch circuit of FIG. 3. As shown in FIG. 4, the complementary signals SO and SOX that are output from an sense amplifier start appearing around timing T1, and are sensed by the sense amplifier to be locked to either a HIGH level or a LOW level. At timing T2 that is one gate delay after the timing T1, one of the latch outputs OL and OLX appears. At timing T3 that is one gate delay after the timing T2, the other one of the latch outputs OL and OLX appears. The reason why the circuit operates in the way described above is that one of the NAND circuits 21 and 22 has an output thereof changed first, and, then, this output change propagates through the other NAND circuit to appear as an output change of this NAND circuit. Thereafter, output signals OUT and OUTX of the output latch circuit come out from the inverters 24 and 23, respectively. One of the output signals OUT and OUTX appear at timing T3, and the other appear at timing T4.

As is understood from the above description, in the related-art output latch circuit of FIG. 3, one of the output data is output following two gate delays from timing T1 to timing T3 after the data of the sense amplifier is locked, and the other one of the output data is output following three gate delays from timing T1 to timing T4.

In the related-art output latch circuit, a four gate delays are generated if the circuit configuration employs the output enable signals, and three gate delays are necessary before all the data is output in the circuit configuration that does not rely on the output enable signals.

Accordingly, there is a need for an output latch circuit that outputs complementary data at high speed, and, also, there is a need for a semiconductor device that is provided with such an output latch circuit.

SUMMARY OF THE INVENTION

It is a general object of the present invention to provide a semiconductor device that substantially obviates one or more of the problems caused by the limitations and disadvantages of the related art.

Accordingly, it is another and more specific object of the present invention to provide a semiconductor device provided with an output latch circuit that outputs complementary data at high speed.

In order to achieve the above objects according to the present invention, a semiconductor device includes two latch circuits, each of which latches a corresponding one of complementary data outputs supplied from an amplifier circuit, and includes only one intervening gate from an input thereof to an output thereof, the latch circuits being reset by an activation signal that activates the amplifier circuit.

In the semiconductor device as described above, the latch circuits are reset at the same timing as the activation of the amplifier circuit, and latch the outputs of the amplifier circuit by a latch including only one intervening gate from the input to the output thereof. Because of this configuration, a time period that passes before the completion of latching is one gate delay after the locking of outputs of the amplifier circuit. Even if the outputs of the latch circuits are output via output buffers having one gate delay, data is output two gate delays after the locking of output of the amplifier circuit.

In detail, each of the latch circuits includes a NAND circuit having two inputs, one of which receives the corresponding one of complementary data outputs supplied from the amplifier circuit, an inverter which receives an output of the NAND circuit as an input thereof, and supplies an output thereof to another one of the two inputs of the NAND circuit, and two transistors connected in series between the output of the NAND circuit and a ground, one of the two transistors receiving at a gate thereof the corresponding one of complementary data outputs supplied from the amplifier circuit, another one of the two transistors receiving the activation signal at a gate thereof, wherein the output of the NAND circuit serves as the output of each of the latch circuits.

Further, in order to eliminate a risk that the latch circuits latch erroneous data in response to the shift toward a LOW level of an amplifier circuit output that is supposed to be HIGH, the NAND circuit described above includes a PMOS transistor which receives the output of the inverter at a gate thereof, and has a source thereof connected to a power supply voltage and a drain thereof connected to the output of the NAND circuit, a first NMOS transistor which receives the output of the inverter at a gate thereof, and has a drain thereof connected to the drain of the PMOS transistor, a second NMOS transistor which receives at a gate thereof the corresponding one of complementary data outputs supplied from the amplifier circuit, and has a drain thereof connected to the source of the first NMOS transistor and a source thereof connected to the ground, and a PMOS transistor which receives at a gate thereof the corresponding one of complementary data outputs supplied from the amplifier circuit, and has a drain thereof connected to the output of the NAND circuit and a source thereof connected to another one of the complementary data outputs supplied from the amplifier circuit.

In the configuration described above, the latter PMOS transistor receives a sense amplifier output SO at the gate thereof, and receives a sense amplifier output SOX at the source thereof. When the sense amplifier output SO is pulled toward to the LOW level, the sense amplifier output SO and the sense amplifier output SOX maintain the same voltage level. There is thus no voltage difference between the gate and the source of this PMOS transistor, so that no threshold voltage is provided to make the transistor conductive. As a result, the output of the NAND circuit does not erroneously become HIGH to latch erroneous data.

Further, in order to eliminate a risk that the latch circuits latch erroneous data in response to the shift toward a LOW level of an amplifier circuit output that is supposed to be HIGH, each of the latch circuits includes a first NAND circuit having two inputs, one of which receives the corresponding one of complementary data outputs supplied from the amplifier circuit, a second NAND circuit which has an input thereof receiving an output of the first NAND circuit, and has another input thereof receiving a reset signal, an output of the second NAND circuit being supplied to another one of the two inputs of the first NAND circuit, and two transistors connected in series between the output of the first NAND circuit and a ground, one of the two transistors receiving at a gate thereof the corresponding one of complementary data outputs supplied from the amplifier circuit, and another one of the two transistors receiving the activation signal at a gate thereof, wherein the output of the first NAND circuit serves as the output of each of the latch circuits, and a latch function of each of the latch circuits is suspended during an activation period of the reset signal.

In the configuration described above, the data latch function of the latch circuits is temporarily suspended to eliminate a risk that the latch circuits latch erroneous data when the sense amplifier output that is supposed to be HIGH is pulled toward to the LOW level.

Other objects and further features of the present invention will be apparent from the following detailed description when read in conjunction with the accompanying drawings.

BRIEF DESCRIPTION OF THE DRAWINGS

FIG. 9 is a circuit diagram showing a structure of a NAND circuit of a RS flip-flop that can prevent erroneous latching;

FIG. 10 is a timing chart for explaining the function of the NAND circuit of FIG. 9;

FIG. 11 is a circuit diagram of a RS flip-flop that can prevent erroneous latching; and FIG. 12 is a timing chart for explaining operations of the output latch circuit of FIG. 11.

DESCRIPTION OF THE PREFERRED EMBODIMENTS

In the following, embodiments of the present invention will be described with reference to the accompanying drawings.

Figure 1:
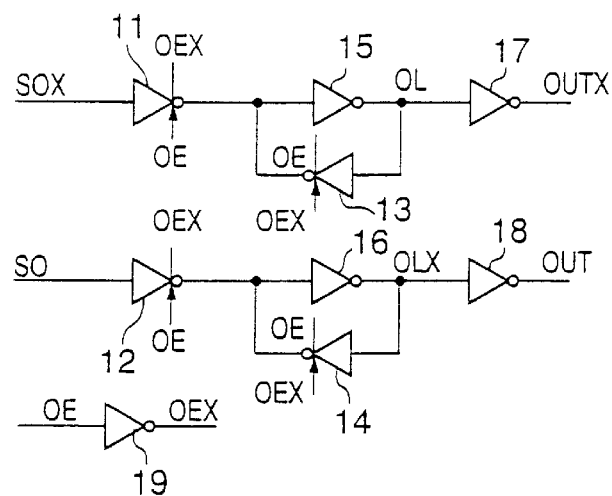
FIG. 1 shows an output latch circuit that outputs complementary data in a related-art semiconductor memory device.
Figure 2:
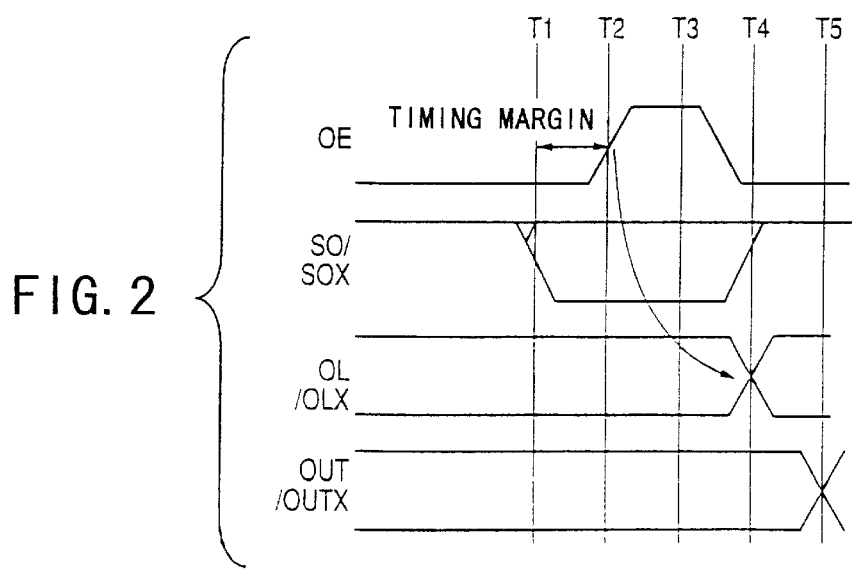
FIG. 2 is a timing chart showing operation timings of the output latch circuit of FIG. 1.
Figure 3:
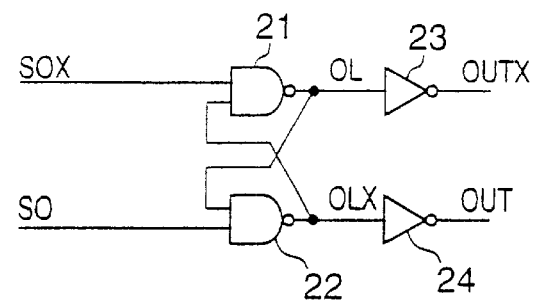
FIG. 3 shows an output latch circuit that does not rely on output enable signals in a related-art semiconductor memory device.
Figure 4:
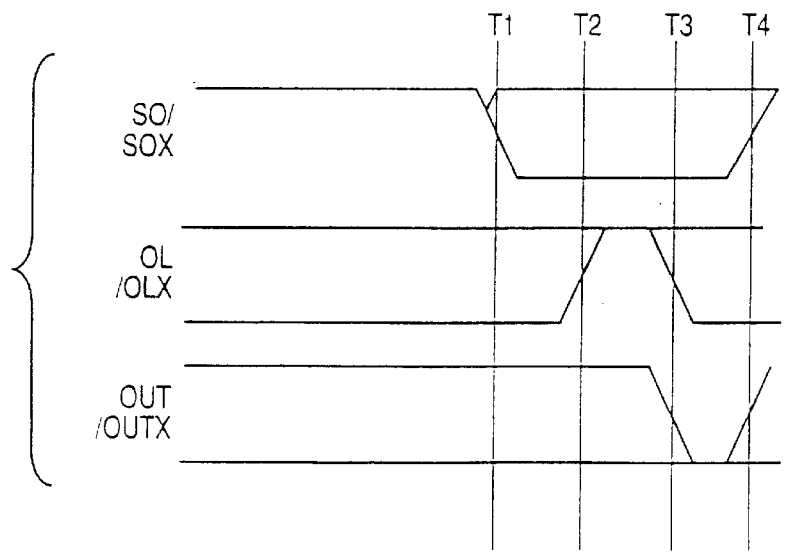
FIG. 4 is a timing chart showing operation timings of the output latch circuit of FIG. 3.
Figure 5:
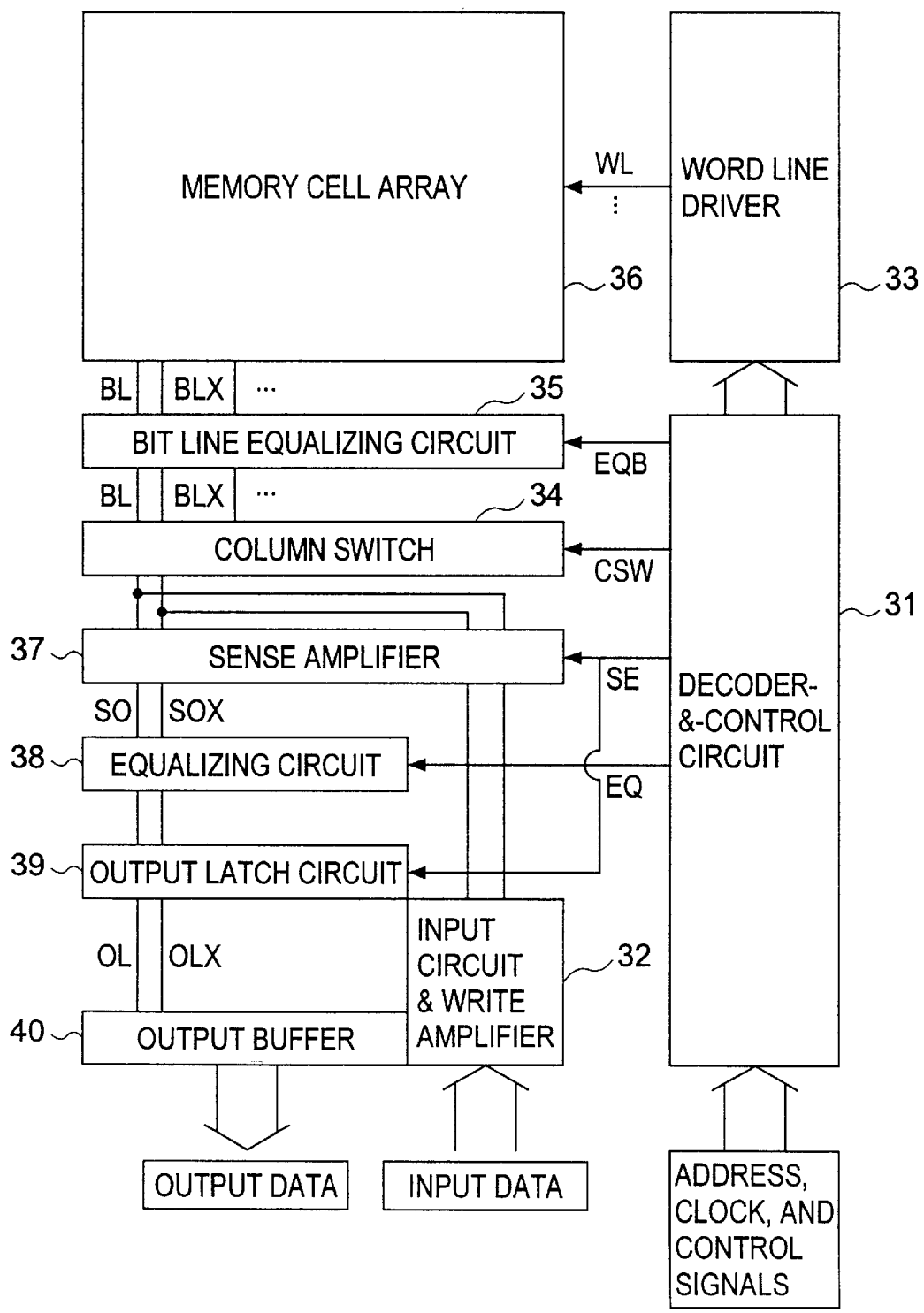
FIG. 5 is a block diagram of a semiconductor memory device that employs an output latch circuit of the present invention.

FIG. 5 is a block diagram of a semiconductor memory device that employs an output latch circuit of the present invention.

The semiconductor memory device of FIG. 5 includes a decoder-&-control circuit 31, an input circuit & write amplifier 32, a word line driver 33, a column switch 34, a bit line equalizing circuit 35, a memory cell array 36, a sense amplifier 37, an equalizing circuit 38, an output latch circuit 39, and an output buffer 40.

The decoder-&-control circuit 31 includes an input circuit that receives address signals, a clock signal, and control signals from an exterior of the device, and further includes a command decode/control circuit for decoding commands and controlling internal units of the semiconductor memory device in accordance with the decoded results. The decoder-&-control circuit 31 supplies the address decoded results to the word line driver 33 and the column switch 34.

The word line driver 33 activates a word line specified by the decoded address, so that the data of memory cells connected to the activated word line are supplied to the column switch 34 via the bit lines. The word lines, bit lines, and memory cells are provided in the memory cell array 36. The column switch 34 selects a column specified by the decoded address, and supplies the data of the bit lines corresponding to the selected column to the sense amplifier 37. Here, the memory cell array 36 sets the bit lines to a predetermined voltage potential prior to a data read operation, thereby equalizing voltage potentials between paired bit lines.

The sense amplifier 37 amplifies the read data, and supplies the amplified data to the output latch circuit 39 as the sense amplifier outputs SO and SOX. The data handled in this configuration is complementary data that includes a pair of data signals comprised of a positive logic signal and a negative logic signal. The output latch circuit 39 latches the read data, and supplies the latched data to the output buffer 40 as latch outputs OL and OLX. The output buffer 40 outputs the supplied data to the exterior of the semiconductor memory device. The equalizing circuit 38 sets the data lines to a predetermined voltage potential prior to a data read operation, thereby equalizing voltage potentials between paired data lines.

The input circuit & write amplifier 32 receives data to be written from the exterior of the device, and amplifies the data, followed by supplying the data to the column switch 34. The data passes through the same routes as those used during the data read operation by propagating in an opposite direction, and is written in a memory cell of a selected word in the memory cell array 36 after passing through the column switch 34, the bit lines, and so on.

In the semiconductor memory device described above, the output latch circuit 39 operates at fast speed according to the benefit of the present invention, and is driven by a sense amplifier activation signal SE that activates the sense amplifier 37.

Figure 6:
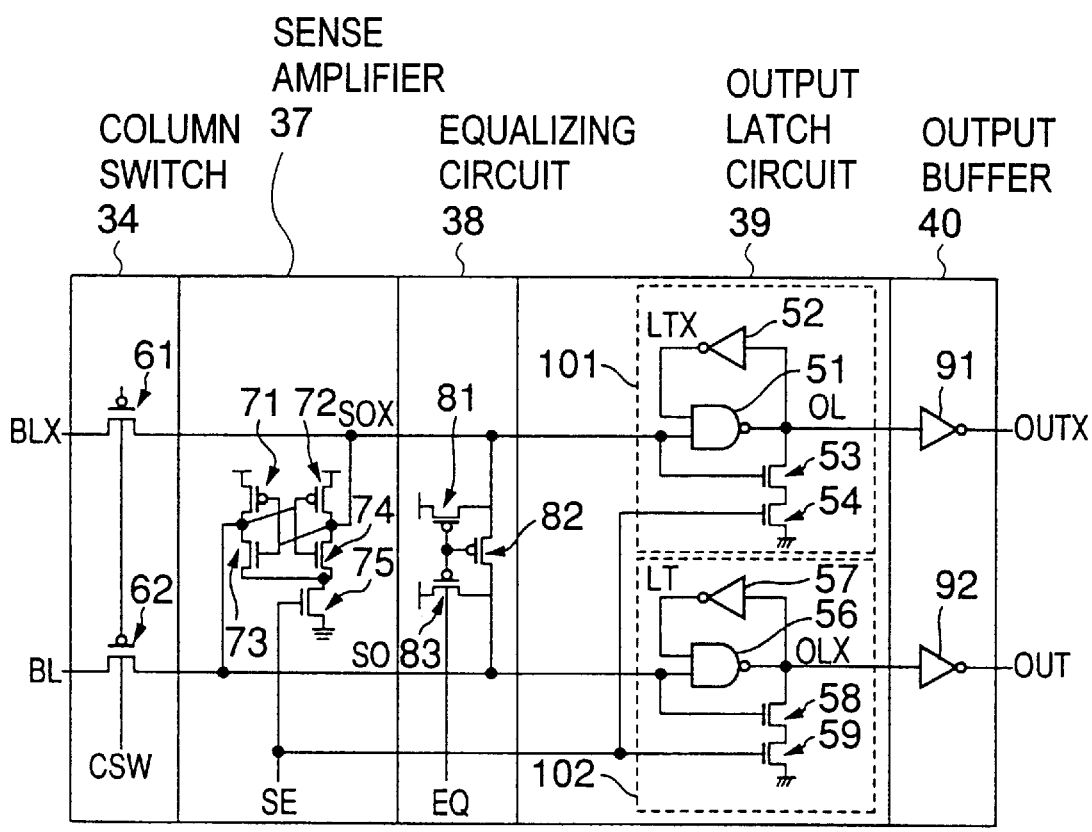
FIG. 6 is a circuit diagram showing the output latch circuit and relevant circuitry according to the present invention.

FIG. 6 is a circuit diagram showing the output latch circuit 39 and relevant circuitry according to the present invention.

The output latch circuit 39 of FIG. 6 includes RS flip-flops 101 and 102. The RS flip-flop 101 includes a NAND circuit 31, an inverter 52, and NMOS transistors 53 and 54. The RS flip-flop 102 includes a NAND circuit 56, an inverter 57, and NMOS transistors 58 and 59. Each of the RS flip-flops 101 and 102 receives a sense amplifier activation signal SE as a reset input from the decoder-&-control circuit 31 (see FIG. 5).

The column switch 34 shown in FIG. 6 includes PMOS transistors 61 and 62. When a relevant column switch signal CSW supplied from the decoder-&-control circuit 31 (see FIG. 5) becomes LOW, the PMOS transistors become conductive, thereby coupling bit lines BLX and BL to the sense amplifier 37.

The sense amplifier 37 includes PMOS transistors 71 and 72 and NMOS transistors 73 through 75. When the sense amplifier activation signal SE supplied form the decoder-&-control circuit 31 (FIG. 5) becomes HIGH, the sense amplifier is activated, thereby amplifying the signals supplied from the bit lines BLX and BL. These amplified signals are supplied to the output latch circuit 39 as the output signals SOX and SO of the sense amplifier 37.

The equalizing circuit 38 includes PMOS transistors 81 through 83. When an equalizing signal EQ supplied from the decoder-&-control circuit 31 (FIG. 5) becomes LOW, the PMOS transistors 81 through 83 become conductive. This sets the outputs of the sense amplifier to a predetermined voltage potential (HIGH voltage level), and, also, equalizes voltage potentials between the two data lines.

The latch outputs OL and OLX of the output latch circuit 39 are supplied to the output buffer 40. The output buffer 40 includes inverters 91 and 92, and outputs the supplied complementary data to the exterior of the semiconductor memory device as output data OUTX and OUT.

Figure 7:
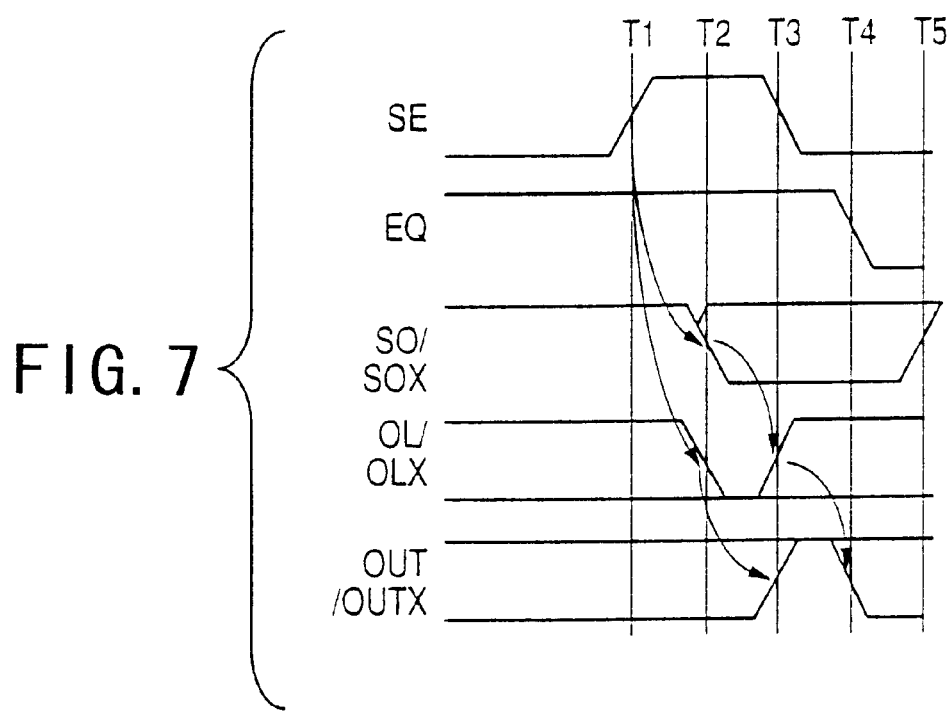
FIG. 7 is a timing chart showing operation timings of the output latch circuit of FIG. 6.

FIG. 7 is a timing chart showing operation timings of the output latch circuit of FIG. 6.

The sense amplifier activation signal SE becomes HIGH at timing T1. In response, the sense amplifier 37 starts operation, resulting in the sense amplifier outputs SO and SOX starting to appear. After passage of a predetermined time period, the sense amplifier outputs SO and SOX are locked by the sense operation of the sense amplifier 37. The sense amplifier outputs SO and SOX are locked around timing T2 that is one gate delay after timing T1. Further, in response to the sense amplifier activation signal SE, the latch outputs OL and OLX of the output latch circuit 39 are reset at timing T2 that is one gate delay after the timing T1. This is because the NMOS transistors 54 and 59 are made conductive by the sense amplifier activation signal SE, and the NMOS transistors 53 and 58 are in a conductive state at this point of time, so that the latch outputs OL and OLX are coupled to the ground.

The latch outputs OL and OLX of the RS flip-flops 101 and 102 of the output latch circuit 39 are supplied to the output buffer 40. The output buffer 40 supplies the complementary data to the exterior of the semiconductor memory device as the output data OUTX and OUT-via the inverters 91 and 92. The output timing of the output data OUTX and OUT is delayed by the inverters 91 and 92 by one gate delay, and, thus, is equal to timing T4. Here, the LOW data of the latch outputs OL and OLX does not change after the reset at the timing T2, so that the corresponding HIGH data of the output data OUTX and OUT is output at timing T3 in reality.

In the present invention as described above, the HIGH output is output at timing T3 one gate delay after the activation of the sense amplifier at the timing T2, and the LOW output is output at timing T4 two gate delays after. Compared with the related-art latch output circuit, therefore, the data output timing can be advanced.

Figure 8:
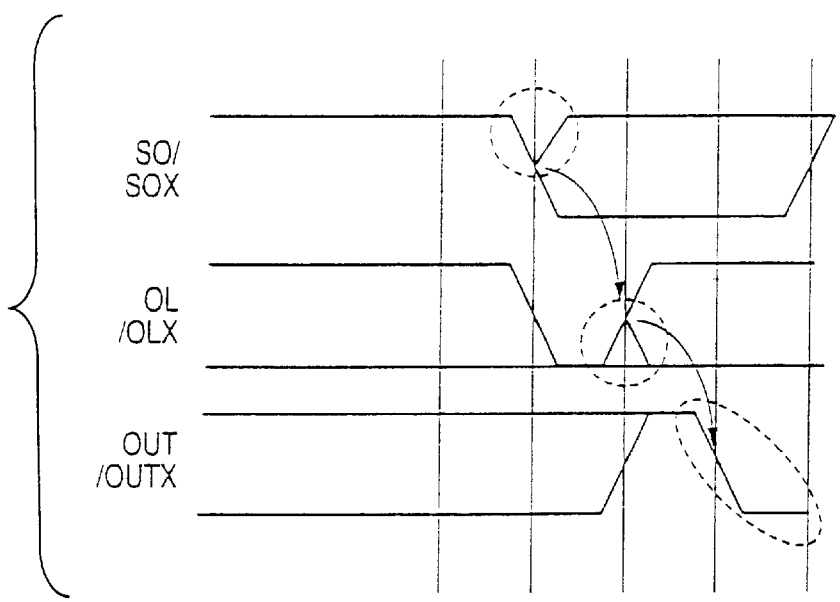
FIG. 8 is a timing chart for explaining the problem of erroneous latching by RS flip-flops of the output latch circuit.

FIG. 8 is a timing chart for explaining the problem of erroneous latching by the RS flip-flops of the output latch circuit.

The complementary outputs SO and SOX of the sense amplifier 37 are equalized prior to data outputting so as to be placed in a HIGH-level condition. As the sense amplifier 37 is activated, only one of the complementary outputs SO and SOX shits to the LOW level under ideal conditions, leaving the other output at the HIGH level to which it is equalized. In reality, however, when the sense amplifier 37 is activated, both of the complementary outputs SO and SOX of the sense amplifier 37 are shifted toward the LOW level for a short duration, as shown in FIG. 8. Thereafter, one of the two signals becomes LOW, and the other is pulled back to the HIGH level by the sense operation of the sense amplifier 37.

When this happens, the latch output (one of OL and OLX) that should be LOW to correspond to the HIGH sense amplifier output is shifted toward the HIGH level as the supposedly HIGH sense amplifier output is pulled toward the LOW level. If this shift reaches a certain amount, it is possible that the RS flip-flop 101 or 102 latches erroneous data. Namely, HIGH data may be latched when LOW data is supposed to be latched. If such erroneous latching occurs, as shown in FIG. 8, the outputs OUT and OUTX of the output buffer 40 both become LOW.

It is thus desirable to implement a configuration that prevents such erroneous latching.

FIG. 9 is a circuit diagram showing a structure of a NAND circuit of a RS flip-flop that can prevent erroneous latching.

FIG. 9 shows a circuit configuration of the NAND circuit 51 or 56 of the RS flip-flop 101 or 102. The NAND circuit of FIG. 9 includes a PMOS transistor 111, NMOS transistors 112 and 113, and a PMOS transistor 114. This circuit structure in itself is not at all different from a conventional NAND circuit. In the present invention, however, the source of the PMOS transistor 114 is connected to a sense amplifier output that is different from the sense amplifier output that is input to this NAND circuit. Namely, if the input to this NAND circuit is the sense amplifier output SO, the source of the PMOS transistor 114 is connected to the sense amplifier output SOX. On the other hand, if the input to the NAND circuit is the sense amplifier output SOX, the source of the PMOS transistor 114 is connected to the sense amplifier output SO.

FIG. 10 is a timing chart for explaining the function of the NAND circuit of FIG. 9.

As shown in FIG. 10, as the sense amplifier 37 is activated, both the complementary outputs SO and SOX of the sense amplifier 37 temporarily shift toward the LOW level. For the sake of explanation, it is assumed that the sense amplifier output SO is supposed to be HIGH. In this case, the NAND circuit that receives the sense amplifier output SO as an input thereto has the source thereof connected to the sense amplifier output SOX. When the sense amplifier output SO is pulled toward to the LOW level, as shown in FIG. 10, the sense amplifier output SO and the sense amplifier output SOX maintain the same voltage level. There is thus no voltage difference between the gate and the source of the PMOS transistor 114, so that no threshold voltage is provided to make the transistor conductive. As a result, the output of the NAND circuit does not erroneously become HIGH to latch erroneous data. In this manner, the output signals OUT and OUTX of the output buffer 40 are insured of correct data levels.

As for the NAND circuit that receives the LOW sense amplifier output SOX as an input thereto, this NAND circuit supplies a HIGH output because the PMOS transistor 114 operates normally when the sense amplifier outputs SO and SOX generate a sufficient voltage difference as they are locked by the sense amplifier.

In this manner, the present invention as described above prevents the RS flip-flop from latching erroneous data when the sense amplifier output that is supposed to be HIGH is pulled toward the LOW level, thereby achieving a stable and reliable data output operation.

FIG. 11 is a circuit diagram of a RS flip-flop that can prevent erroneous latching.

In FIG. 9, the RS flip-flops 101 and 102 are configured not to output erroneous outputs, thereby preventing erroneous latching. In the configuration of FIG. 11, on the other hand, NAND circuits 51 and 56 produce erroneous outputs in response to erroneous data inputs, but a loop for the latch is cut off during the presence of data noise so as not to latch the erroneous data.

In FIG. 11, an output latch circuit 39A includes RS flip-flops 101A and 102A. The RS flip-flop 101A include a NAND circuit 51, NMOS transistors 53 and 54, and a NAND circuit 121. The RS flip-flop 102A include a NAND circuit 56, NMOS transistors 58 and 59, and a NAND circuit 122. The NAND circuits 121 and 122 are provided to replace the inverters 52 and 57 of the output latch circuit 39 shown in FIG. 6.

In the RS flip-flops 101A and 102A shown in FIG. 11, one of the inputs of the NAND circuits 121 and 122, each of which is part of a corresponding latch loop, receives a second reset signal LCKX. The second reset signal LCKX is set to LOW to cut off the latch loop, thereby suspending the data latch function of the circuit.

FIG. 12 is a timing chart for explaining operations of the output latch circuit of FIG. 11.

As shown in FIG. 12, as the sense amplifier 37 is activated, both the complementary outputs SO and SOX of the sense amplifier 37 temporarily shift toward the LOW level. The sense amplifier output that is supposed to be HIGH is pulled toward to the LOW level, and, in response, the latch output (OL or OLX) that is supposed to be LOW temporarily shifts toward the HIGH level. When the amount of this shift reaches a certain level, erroneous data may be latched if no specific measure is taken. In the configuration of FIG. 11, the data latch function of the latch circuit is suspended during a period when the second reset signal LCKX is LOW. In FIG. 12, therefore, even though one of the latch outputs OL and OLX suffers noise at timing T3, this noise is not mistaken as proper data to be latched. After the timing T3 at which noise occurs in the latch output OL or OLX, the second reset signal LCKX returns to a deactivated state (HIGH), so that correct data without noise is latched. As a result, the output signals OUT and OUTX of the output buffer 40 are set to correct data levels.

As shown in FIG. 12, the second reset signal LCKX is activated to a LOW level prior to timing T3 at which noise occurs in the latch output OL or OLX, and is deactivated to a HIGH level before equalizing.

In the present invention as described above, the data latch function of the output latch circuit is temporarily suspended, thereby eliminating a risk of latching erroneous data by a RS flip-flop in response to a shift toward the LOW level of a sense amplifier output that is supposed to be HIGH. This achieves stable and reliable data output operations.

The above embodiments have been described with reference to a semiconductor memory device, but the output latch circuit of the present invention is not limited to application to semiconductor memory devices. The output latch circuit of the present invention is applicable to any device as long as the device latches an output of an amplifier circuit such as a sense amplifier and supplies the latched output to the exterior of the device.

Further, the present invention is not limited to these embodiments, but various variations and modifications may be made without departing from the scope of the present invention.

The present application is based on Japanese priority application No. 2000-391368 filed on Dec. 22, 2000, with the Japanese Patent Office, the entire contents of which are hereby incorporated by reference.

What is claimed is:

1. A semiconductor device, comprising two latch circuits, each of which latches a corresponding one of complementary data outputs supplied from an amplifier circuit, and includes only one intervening gate from an input thereof to an output thereof, said latch circuits being reset by an activation signal that activates the amplifier circuit.

2. The semiconductor device as claimed in claim 1, wherein the amplifier circuit is a sense amplifier that amplifies data read from a memory cell, and the activation signal is a sense amplifier activation signal.

3. The semiconductor device as claimed in claim 1, wherein each of said latch circuits includes:
   a NAND circuit having two inputs, one of which receives said corresponding one of complementary data outputs supplied from the amplifier circuit;
   an inverter which receives an output of said NAND circuit as an input thereof, and supplies an output thereof to another one of the two inputs of said NAND circuit; and
   two transistors connected in series between the output of said NAND circuit and a ground, one of said two transistors receiving at a gate thereof said corresponding one of complementary data outputs supplied from the amplifier circuit, another one of said two transistors receiving the activation signal at a gate thereof, wherein the output of said NAND circuit serves as the output of each of said latch circuits.

4. The semiconductor device as claimed in claim 3, wherein said NAND circuit includes:

a PMOS transistor which receives the output of said inverter at a gate thereof, and has a source thereof connected to a power supply voltage and a drain thereof connected to the output of said NAND circuit;

a first NMOS transistor which receives the output of said inverter at a gate thereof, and has a drain thereof connected to the drain of said PMOS transistor;

a second NMOS transistor which receives at a gate thereof said corresponding one of complementary data outputs supplied from the amplifier circuit, and has a drain thereof connected to the source of said first NMOS transistor and a source thereof connected to the ground; and a PMOS transistor which receives at a gate thereof said corresponding one of complementary data outputs supplied from the amplifier circuit, and has a drain thereof connected to the output of said NAND circuit and a source thereof connected to another one of said complementary data outputs supplied from the amplifier circuit.

5. The semiconductor device as claimed in claim 1, wherein each of said latch circuits includes:

a first NAND circuit having two inputs, one of which receives said corresponding one of complementary data outputs supplied from the amplifier circuit;

a second NAND circuit which has an input thereof receiving an output of said first NAND circuit, and has another input thereof receiving a reset signal, an output of said second NAND circuit being supplied to another one of the two inputs of said first NAND circuit; and two transistors connected in series between the output of said first NAND circuit and a ground, one of said two transistors receiving at a gate thereof said corresponding one of complementary data outputs supplied from the amplifier circuit, another one of said two transistors receiving the activation signal at a gate thereof, wherein the output of said first NAND circuit serves as the output of each of said latch circuits, and a latch function of each of said latch circuits is suspended during an activation period of the reset signal.

6. The semiconductor memory device, comprising:

a sense amplifier, which is responsive to an activation signal to amplify complementary signals representing data read from a memory cell;

two latch circuits, each of which latches a corresponding one of complementary output signals supplied from said sense amplifier, and includes only one intervening gate from an input thereof to an output thereof; and an output buffer which supplies outputs of said latch circuits, wherein the activation signal that activates said sense amplifier resets said latch circuits.

7. The semiconductor memory device as claimed in claim 6, wherein each of said latch circuits is provided with a function to suspend a latch function thereof in response to a latch function suspension signal, said latch function being suspended in response to the latch function suspension signal during a period in which at least one of the outputs of said latch circuits is unstable.

8. The semiconductor device as claimed in claim 1, wherein each of said latch circuits includes:

a first NAND circuit having two inputs, one of which receives said corresponding one of complementary data outputs supplied from the amplifier circuit;

a second NAND circuit which has an input thereof receiving an output of said first NAND circuit, and has another input thereof receiving a drive signal, an output of said second NAND circuit being supplied to another one of the two inputs of first said NAND circuit; and two transistors connected in series between the output of said first NAND circuit and a ground, one of said two transistors receiving at a gate thereof said corresponding one of complementary data outputs supplied from the amplifier circuit, another one of said two transistors receiving the activation signal at a gate thereof, wherein the output of said first NAND circuit serves as the output of each of said latch circuits, and a latch function of each of said latch circuits is suspended during an activation period of the drive signal.

9. The semiconductor device as claimed in claim 1, wherein one of the latch circuits has a function to suspend latching temporarily.

10. The semiconductor device as claimed in claim 1, wherein one of the latch circuits has at least one transistor connected to the data output which the latch circuit does not latch.

11. The semiconductor device as claimed in claim 8, wherein one of the latch circuits has at least one transistor connected to the data output which the latch circuit does not latch.

12. A semiconductor device, comprising two latch circuits, each of which latches a corresponding one of complementary data outputs supplied from an amplifier circuit, and includes only one intervening gate from an input thereof to an output thereof, said latch circuits being driven by an activation signal that activates the amplifier circuit.

13. The semiconductor device as claimed in claim 12, wherein one of the latch circuits has a function to suspend latching temporarily.

14. The semiconductor memory device, comprising:

a sense amplifier, which is responsive to an activation signal to amplify complementary signals representing data read from a memory cell;

two latch circuits, each of which latches a corresponding one of complementary output signals supplied from said sense amplifier, and includes only one intervening gate from an input thereof to an output thereof; and an output buffer which supplies outputs of said latch circuits, wherein the activation signal that activates said sense amplifier drives said latch circuits.

15. A semiconductor device, comprising two latch circuits, each of which latches a corresponding one of complementary data outputs supplied from an amplifier circuit, and includes only one inverting gate from an input thereof to an output thereof, said latch circuits latching the corresponding data output on the basis of an activation signal that activates the amplifier.

* * * * *